United States Patent [19]

Kyuma et al.

[11] Patent Number: 4,803,429
[45] Date of Patent: Feb. 7, 1989

[54] RECOVERING POLARIZATION OF LIGHT OF ARBITRARY POLARIZATION PROPAGATING THROUGH DISTORING MEDIUM BY PHASE CONJUGATION REFLECTION BACK THROUGH SAID MEDIUM

[75] Inventors: Kazuo Kyuma, Nishinomiya, Japan; Sze-Keung Kwong, Long Beach; Amnon Yariv, San Marino, both of Calif.

[73] Assignee: California Institute of Technology, Pasadena, Calif.

[21] Appl. No.: 907,667

[22] Filed: Sep. 15, 1986

[51] Int. Cl.[4] ............................................. G01R 33/02
[52] U.S. Cl. ..................................... 324/244; 356/345
[58] Field of Search ................... 324/244, 96, 260; 356/345, 350; 350/374, 162.12, 396

[56] References Cited

U.S. PATENT DOCUMENTS

| | | | |
|---|---|---|---|
| 4,187,000 | 2/1980 | Constant | 350/162.12 |
| 4,281,905 | 8/1981 | Harvey et al. | 350/377 |
| 4,522,495 | 6/1985 | Shajenko | 356/345 |
| 4,536,861 | 8/1985 | Graindorge et al. | 367/149 |
| 4,571,080 | 2/1986 | Papuchon et al. | 356/345 |
| 4,575,245 | 3/1986 | Bordé | 356/345 |
| 4,681,446 | 7/1987 | Yeh | 356/350 |

OTHER PUBLICATIONS

Fischer et al., "Image Transmission and Interferometry with Multimode Fibers Using Self-Pumped Phase Conjucation", *App. Phys. Letters*, Jan. 5, 1985 pp. 113–114.
Feinberg, "Self-Pumped, Continuous-Wave Phase Conjugator Using Internal Reflection", *Optics Letters*, Oct., 1982, pp. 486–488.
Yariv, "Three-Dimensional Pictorial Transmission in Optical Fibers", *Applied Phys. Letters*, Jan. 15, 1976 pp. 88–89.
Cohen, "Measured Attenuation and Depolarization of Light Transmitted Along Glass Fibers", *The Bell System Technical Journal*, Jan. 1971, pp. 23–42.
McMichael et al, "Scolar Phase Conjugation Using a Barium Titanate Crystal", *Tech. Dig.* May 23, 1985 p. 220.
Yeh, "Scolar Phase Conjugator for Polarization Correction", *Optics Communications*, Sep. 1, 1984, pp. 195–197.
Yariv, "Compensation for Atmospheric Degradation of Optical Beam Transmission by Nonlinear Optical Mixing", *Optics Communication*, Apr. 1977, pp. 49–50.

*Primary Examiner*—Reinhard J. Eisenzopf
*Assistant Examiner*—Warren S. Edmonds
*Attorney, Agent, or Firm*—Freilich, Hornbaker, Rosen & Fernandez

[57] ABSTRACT

The tensorial nature of the nonlinear constant or the electro-optic coefficient of the phase conjugate material makes it impossible to perform true phase conjugation of fields with arbitrary polarization states, i.e., to recover the polarization state of the incident light of arbitrary polarization after the phase conjugation. It is demonstrated here that an optical wave propagating through a polarization and mode scrambling medium can regain its original polarization state after phase conjugation followed by reverse propagation through the polarization and mode scrambling medium. Such polarization recovery is achieved even while a magnetic field is applied to the medium, but with power loss proportional to the magnitude of the magnetic field.

9 Claims, 5 Drawing Sheets

RECOVERING POLARIZATION OF LIGHT OF ARBITRARY POLARIZATION PROPAGATING THROUGH DISTORING MEDIUM BY PHASE CONJUGATION REFLECTION BACK THROUGH SAID MEDIUM

ORIGIN OF INVENTION

The invention described herein was made in the performance of work sponsored by the U.S. Air Force Office of Scientific Research and the United States Army Research Office, Contract No. DAAG29-85-K-0261, and is subject to the provisions of Public Law 96-517 (35 USC 202) in which the Contractor has elected to retain title.

BACKGROUND OF THE INVENTION

This invention relates to a method and apparatus for recovering the polarization state of an incident light wave of arbitrary polarization reflected by a phase conjugate mirror; i.e., for obtaining true phase conjugation of a field of arbitrary polarization.

An optical wave propagating through a distorting medium can regain its original state by phase conjugation followed by reverse propagation through the distorting medium. A. Yariv, Appl, Phys. Lett. 28, 88 [1976], A. Yariv, Opt. Commun 21, 49, [1977]. However, the tensorial nature of the nonlinear constant $\chi^{(3)}$, and that of the electro-optic effect, make it impossible to perform true phase conjugation on fields with arbitrary polarization. It has been thought heretofore that true phase conjugation of fields with arbitrary polarization can be obtained only by separate phase conjugation of the individual transverse components of the field. P. Yeh, Opt. Commun., 51, 195 [1984]; I. McMichael, and M. Khoshnevisan, Technical Digest, Conference on Lasers and Electro-Optics, paper THN1 [1985]. An object of this invention is to provide true phase conjugation.

SUMMARY OF THE INVENTION

In accordance with the present invention, true phase conjugation of an incident light wave of arbitrary polarization is achieved by employing a tandem combination of polarization and mode scrambling and phase conjugation. An optical wave of arbitrary polarization, i.e., having both x and y transverse components can be reflected by a single phase conjugate mirror if the optical wave is first passed through a polarization and mode scrambling medium and then, after phase conjugation, propagating the wave back through the medium in reverse. The wave regains its original polarization state. The presence of a magnetic field induces a nonreciprocal Faraday rotation on a light beam, but that effect is eliminated by the tandem combination of polarization scrambling and phase conjugation, with only some loss in the total output power, which loss is proportional to the intensity magnitude of the magnetic field.

DESCRIPTION OF PREFERRED EMBODIMENTS

As just noted above, it has been discovered that the original state of polarization in phase conjugation is achieved by placing a polarization and mode scrambling medium in the path of an incident wave of arbitrary polarization and its return phase conjugate wave produced by a phase conjugate mirror (PCM).

Figure 1A:
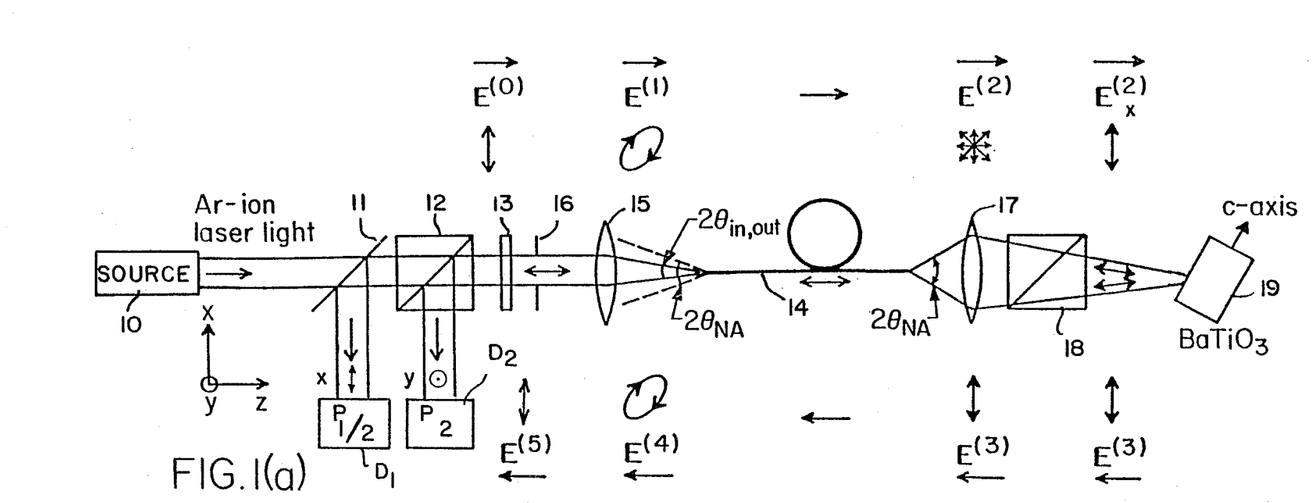
FIG. 1(a) illustrates an arrangement for polarization correction, wherein the x-polarized component $E_x^{(2)}$ in the depolarized light $E^{(2)}$ is used to generate the phase conjugate light.

An experimental arrangement for proving this invention is shown in FIG. 1(a). A multilongitudinal mode Argon ion laser beam ($\lambda=514.5$ nm, diameter $=2$ mm) linearly-polarized along the x-axis was used as a beam source 10. The Y axis is into the paper and the Z axis is in the direction of the laser beam as shown. A polarization-independent beam splitter 11 and a polarizing beam splitter 12 were used only to analyze the polarization state of the reflected phase conjugate light; they have nothing to do with recovery of polarization after reflection from a PCM.

Figure 1B:
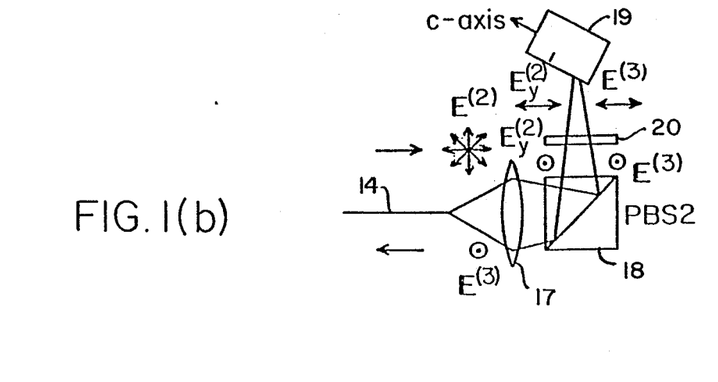
FIG. 1(b) illustrates a variant of the arrangement in FIG. 1(a) in which the y-polarized component $E_y^{(2)}$ is used to generate the phase conjugate light.

In the schematic diagram of FIG. 1(a), the arrows in the light beam path indicate the direction of propagation, as do the arrows adjacent the reference characters $E^{(0)}$ through $E^{(5)}$. The additional two-headed arrows between the reference characters $E^{(0)}$ through $E^{(5)}$ indicate the polarization of the light at those points of discussion, all of which are polarized in the x direction, except for the elliptically polarized light waves $E^{(1)}$ and $E^{(4)}$, and for the random polarized light wave $E^{(2)}$. In FIG. 1(b), which conjugates light polarized in the y direction, that state of polarization is indicated by a dot in a circle, the same as in the case of light reflected by the polarization beam splitter 12 to detector $D_2$.

A half-wave ($\lambda/2$) plate 13, or a quarter-wave ($\lambda/4$) plate, also used only for the experiment, was used to control the polarization state of the input beam $E^{(1)}$ launched into a multimode optical fiber 14 through a lens 15. The $\lambda/2$ plate 13 permits rotation of the polarization direction of linearly-polarized light $E^{(0)}$ from the polarizing beam splitter 12, while a $\lambda/4$ plate in place of the $\lambda/2$ plate converts the linearly-polarized input light $E^{(0)}$ into an arbitrary elliptically polarized light, as shown. Rotating the λ/4 plate will permit adjustment of the ellipticity of the polarized light. Providing either a λ/2 or a λ/4 plate is a convenient way of adjusting the polarization of the light $E^{(1)}$ for experimental purposes. In practice, the incident wave may already be of an arbitrary polarization having both x and y components, or the adjustment could be made in the other elements shown.

A 2 mm diameter aperture 16 eliminates back-reflection from optical components. Once past the λ/2 or the λ/4 plate, and the aperture, the light $E^{(1)}$ is focused into the multimode fiber 14 with a convergence angle of $2\theta_{in} \simeq 1.5°$ using a lens 15 (f=75 mm). The multimode optical fiber was a graded-index type with 100 μm core diameter, 0.25 numerical aperture (NA) and 20 m length (coiled to reduce space). That length is totally arbitrary, and chosen only because optical fibers of that length are readily available.

The emitting angle of the light $E^{(2)}$ from the fiber was measured to be 26°. That value was nearly equal to the value calculated from the NA of the fiber. The polarization character of the emitted light $E^{(2)}$ was analyzed by measuring the Stokes parameters. L. G. Cohen, Bell Syst. Tech. J. 50, 23 [1971]. The measured polarized fraction, which is defined as the ratio of the polarized light power to the total power, was about 3.5%.

The observation, that the output light $E^{(2)}$ from the fiber is nearly completely depolarized and occupies the full angular aperture of the fiber, indicates that the intermode scattering (A. W. Snyder, and J. D. Love, *Optical Waveguide Theory*, [Chapman and Hall, London, 1983]) causes a distribution of the input light, originally fed into a small number of modes, among almost all the propagating modes of both polarizations. This fact plays a crucial role in a theoretical model of the effect.

The emitted light $E^{(2)}$ was focused into a poled BaTiO₃ cyrstal 19 of 4.5 mm×4.5 mm×5 mm dimensions by a 10× mircroscope objective lens 17. A polarizing beam splitter 18 was interposed between the objective lens and the crystal in order to obtain linearly polarized light $E_x^{(2)}$ at the input to the crystal, which was aligned to form a self-pumped phase conjugate mirror. J. Feinberg, Opt. Lett., 7, 486 (1982).

Since both the polarization direction (x-axis) of the linearly-polarized input light $E_x^{(2)}$ and the crystal C-axis were in the plane of the paper, the phase conjugate light $E_x^{(3)} = RE_x^{(2)*}$ was linearly-polarized along the x-axis. This reflected light $E_x^{(3)}$ was automatically coupled into the fiber by the objective lens 17. The emitted cone angle 2θ of the output light $E^{(4)}$ was equal to that of the input beam. If $E^{(4)}$ is the true phase conjugate replica of $E^{(1)}$ (including the polarization state), then the output light $E^{(5)}$ having retraversed the λ/2 of λ/4 plate 13 must return to the complex conjugate of the initial linear-polarized state of $E^{(0)}$. We can thus measure the degree of the polarization recovery from the following equation:

$$p = \frac{P_1 - P_2}{P_1 + P_2} \quad (1)$$

where $P_1$ and $P_2$ are the optical power of the two orthogonal polarization components of $E^{(5)}$ measured by detector detectors $D_1$ and $D_2$. Detector $D_2$ receives light wave component in the y axis separated by the polarization beam splitter 12, as indicated by a dot in a circle. The light wave components in the x axis are passed by the beam splitter 12 to the polarization independent beam splitter 11, which is implemented with a half-silvered mirror which does not alter the polarization of the light waves reflected into the detector $D_1$, but does divide the intensity of the x component by 2. Consequently, to obtain the true value of power $P_1$, the output of detector $D_1$ must be multiplied by 2. When the polarization state is recovered perfectly, the quantity p is unity. On the other hand, when the polarization state is only partially recovered, p is less than unity. p becomes zero in the case of random polarization.

In a modified arrangement shown in FIG. 1(b), y-polarized light is selected to be phase conjugated, rather than x-polarized light. Since the crystal 19 reflects preferentially x-polarized light, the polarization direction was effectively rotated 90° by a λ/2 plate 20 in front of the crystal, but the same result could have been achieved by rotating the crystal 90°. For experimental purposes it is easier to introduce the plate 20 and rotate it rather than to remount the crystal 19. Experiments in which propagation was through free space, instead of the fiber, were also carried out.

Figure 2:
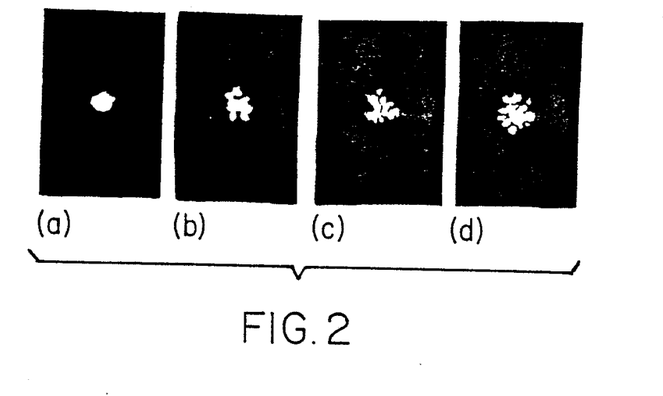
FIG. 2 illustrates in photographs of output light:
(a) 100 times intensity-attenuated horizontal component (phase conjugate replica of the input):
(b) 10 times intensity-attentuated vertical component; and
(c) and (d) background noise of the horizontal and vertical components, respectively, while the phase conjugate mirror is blocked.

The experimental results are illustrated in FIG. 2 which shows in photographs (a)–(d) typical pictures of the horizontal (x-axis) and the vertical (y-axis) polarization components of $E^{(5)}$. The high quality phase conjugate replica of the input light $E^{(0)}$ was observed, as indicated by the strong central spot in photograph (a), and the weak background speckle pattern in photographs (b), (c) and (d).

Figure 3:
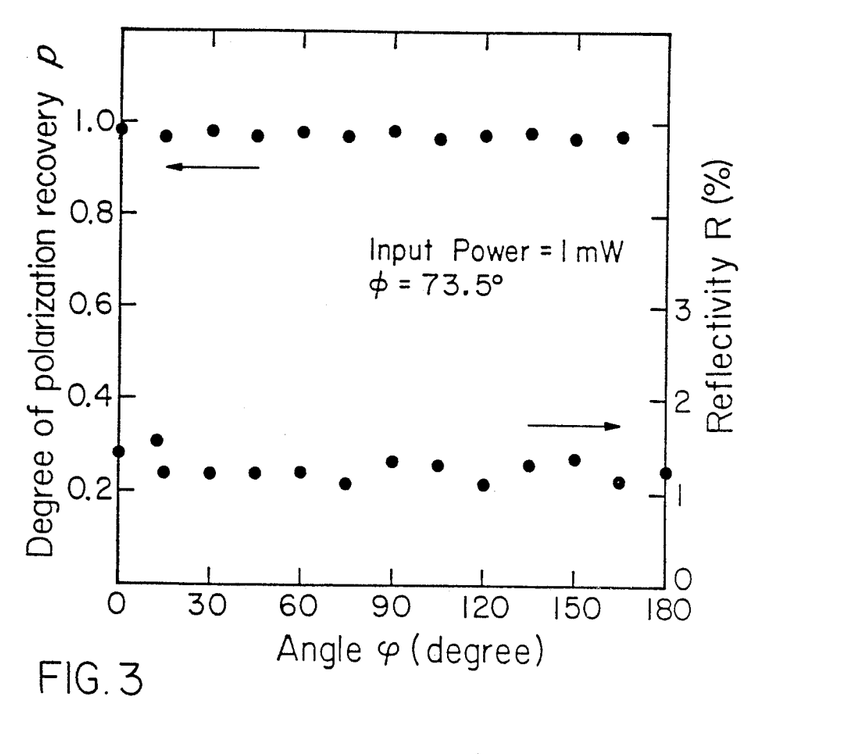
FIG. 3 illustrates degree of the polarization recovery p and reflectivity R of the phase conjugate mirror plotted as a function of the angle $\phi$ between the polarization direction of the input linear-polarized light and the x-axis.

FIG. 3 shows the experimentally observed dependence of the polarization parameter p as a function of the direction of polarization of (φ) of the linearly polarized light entering the fiber 14. This direction was controlled by the angular position of the λ/2 plate 13. The quantity p is seen to be very nearly unity over the whole range indicating a very good (better than 96%) restoration of the original linear polarization.

Figure 4:
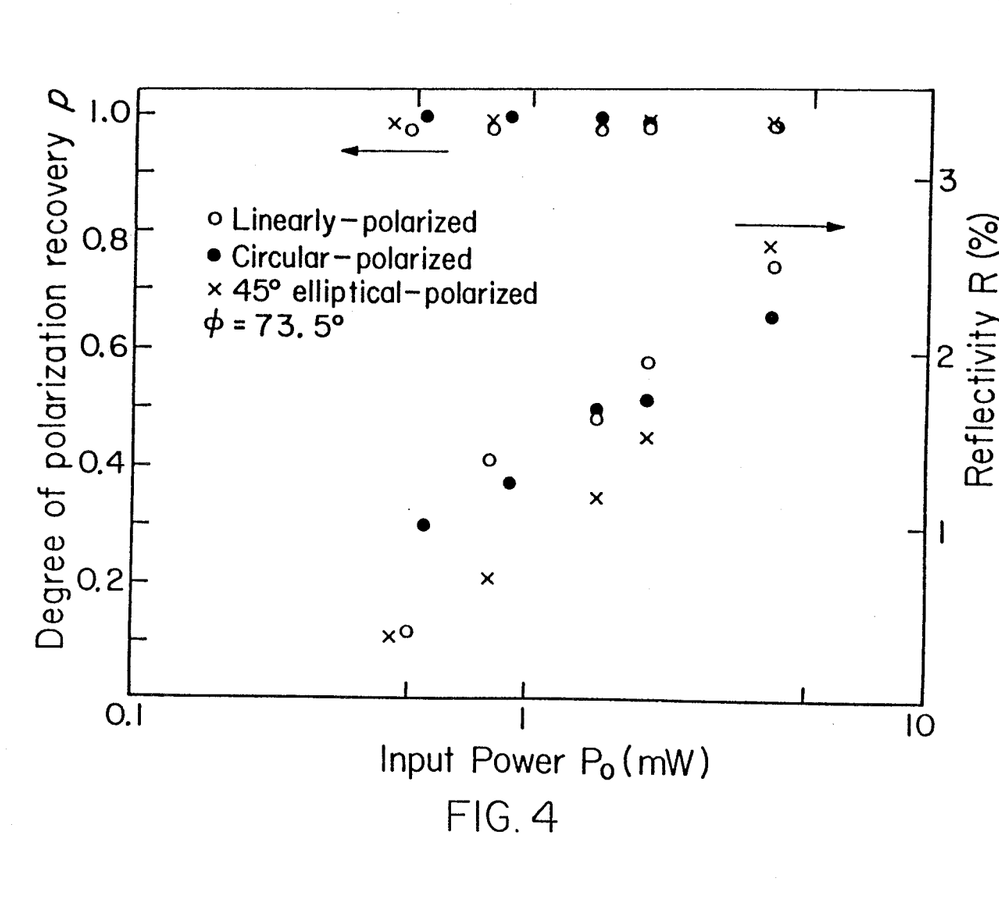
FIG. 4 illustrates degree of the polarization recovery p and reflectivity R of the phase conjugate mirror plotted as a function of the input power $P_0$ for the three different input polarization states: linearly polarized, circular polarized and 45° elliptical polarized.

Also plotted in FIG. 3 is the reflectivity R of the phase conjugator defined by $R = P_1/P_0$ ($P_0$ = input optical power at the crystal). When arbitrary elliptically-polarized light was used as the input $E^{(1)}$, p was also close to unity. FIG. 4 shows p and R as a function of $P_0$ for the three different polarization states at the input: linearly-polarized, circularly-polarized and elliptically-polarized These results were obtained using the experimental arrangements of FIG. 1(a). The experimental results obtained with the arrangement of FIG. 1(b) were substantially the same.

In the case of free-space propagation rather than fiber propagation, the polarization state was recovered only when the input $E^{(2)}$ was linearly polarized along the x-axis, indicating the need for modal scrambling in the fiber 14.

The amazing and most significant observation is that in spite of the fact that the phase-conjugator discards half of all the modes exiting the fiber (the "x" or the "y" polarized modes) complete polarization recovery is achieved. This implies that the initial polarization information is distributed, through modal scrambling, essentially equally between the "x" and "y" modes of the fiber and can be recovered from either one. These observations enable us to note some fundamental properties of the modal scattering matrix of such fibers.

We assume that the multimode fiber can support 2N propagation modes with electric fields $E_n$ ($E_{xn'}$ and $E_{yn'}$ n'=1, 2 ..., N), where the subscripts, x and y denote the two possible polarization states, respectively, and n indicates the mode number. When the laser light with an arbitrary polarization state $E^{(1)}$ ($E_x^{(1)}$, $E_y^{(1)}$) is coupled into the fiber, the excited field can be expressed as the summation of the 2N propagation mode $E_n$ with amplitudes $A^{(1)}$ ($A_x^{(1)}$, $A_y^{(1)}$) as $$E_x^{(1)} = \sum_{n=1}^{N} A_{xn}^{(1)} E_{xn} \quad (2a)$$

$$E_y^{(1)} = \sum_{n=1}^{N} A_{yn}^{(1)} E_{yn} \quad (2b)$$

where the excitation into the radiation modes of the fiber is assumed negligible. The optical field at any plane(s) in the fiber can be represented by a column "vector" of 2N elements $A^{(s)}$ ($A_x^{(s)}$, $A_y^{(s)}$) where the elements of $A_x^{(s)}$ are the N amplitudes $A_{xn}^{(s)}$ and those of $A_y^{(s)}$ are $A_{yn}^{(s)}$. The propagation and scattering in the fiber can be represented by a complex scattering matrix M $$E^{(2)} = \begin{pmatrix} A_x^{(2)} \\ \hline A_y^{(2)} \end{pmatrix} = M \begin{pmatrix} A_x^{(1)} \\ \hline A_y^{(1)} \end{pmatrix} \quad (3)$$

$$M = \begin{pmatrix} M_{xx} & M_{xy} \\ \hline M_{yx} & M_{yy} \end{pmatrix} \quad (4)$$

where each $M_{ij}$ is an N×N matrix.

In the case of true phase conjugation (i.e., one involving both x and y polarizations) we have $$E^{(3)} = r(E^{(2)})^* \quad (5)$$

where r is a constant. Then $$E^{(4)} = rM'M^*(E^{(1)})^* \quad (6)$$

where M' is the fiber scattering matrix for propagation form plane (2) to plane (1). Since for the lossless, zero magnetic field, and linear propagation, Maxwell's equations are invariant to time inversion we have $$E^{(4)} = r(E^{(1)})^*$$

so that $$M'M^* = I \quad (7)$$

or using the submatrices $M_{ij}$ $$\begin{pmatrix} M'_{xx}M^*_{xx} + M'_{xy}M^*_{yx} & M'_{xx}M^*_{xy} + M'_{xy}M^*_{yy} \\ \hline M'_{yx}M^*_{xx} + M'_{yy}M^*_{yx} & M'_{yx}M^*_{xy} + M'_{yy}M^*_{yy} \end{pmatrix} = I \quad (8)$$

We noted that Equation (8) is valid, under the constraints noted above, for any linear lossless dielectric distribution multimode fibers and does not depend on strong intermodal scrambling.

For the experiment described above, where only "x" (or "y") modes are fed back by the phase conjugation of the crystal 19 into the fiber 14, we obtain instead of Equation (6)

$$E^{(4)} = rM'\rho M^*(E^{(1)})^* \quad (9)$$

where is a 2N×2N matrix with unity along the top half of its diagonal and zeros everywhere else (thus eliminating y modes from retroreflection into the fiber), and the asterisk signifies phase conjugation.

Experiments show that $E^{(4)} \cong r(E^{(1)})^*$, so that, to the first approximation, $$M'\rho M^* = \begin{pmatrix} M'_{xx}M^*_{xx} & M'_{xx}M^*_{xy} \\ \hline M'_{yx}M^*_{xx} & M'_{yx}M^*_{xy} \end{pmatrix} \cong I \quad (10)$$

and in terms of the individual N×N matrices of Equation (8)

$$M_{xx}'M_{xx}^* \cong M_{yx}'M_{xy}^* \cong I \quad (11a)$$

$$M_{yx}'M_{xx}^* \cong M_{xx}'M_{xy}^* << I \quad (11b)$$

The non-zero, but small, off-diagonal elements in Equations (11a) and (11b) are responsible for the weak speckled dots observed outside phase conjugate beam. The elements of $M_{yx}'M_{xy}^*$ describe how y modes initially present are recreated, in spite of their elimination by the phase conjugate mirror (crystal 16), by virtue of scattering $|y\rangle \rightarrow |x\rangle$ on the way to the crystal followed by $|x\rangle \rightarrow |y\rangle$ on the way back. A comparison to the lower diagonal element of Equation (8) shows that in a scrambling fiber $$M_{yx}'M_{xy}^* \cong M_{yy}'M_{yy}^* \quad (12)$$

so that the process of storing the $|y\rangle$ information in $|x\rangle$ modes is as efficient as that in which the scattering paths involve $|y\rangle$ modes only.

The main practical uses of the present invention described above involve the reduction of noise and signal fading in sensor applications experiments and optical gyros which employ optical fibers, as well as in polarization sensitive experiments. A further advantage in optical gyros is that the fiber need not be so fabricated as to preserve polarization. Such single mode polarization preserving fiber is more expensive to fabricate than modal scrambling multimode fiber. In other words, by using the technique of the present invention to recover polarization, it is not necessary to require that fiber used in a system preserve polarization of the laser beam.

The polarization recovery demonstrated by the experiments described with reference to FIGS. 1(a) and (b) has been achieved even while a magnetic field is applied along the fiber 14. The experimental arrangement for demonstrating this is shown in FIG. 5 where components common to the arrangement of FIG. 1(a) have been identified by the same reference numeral, and components not necessary for this experiment have been omitted.

The output light from the multilongitudinal mode Argon ion laser was coupled into a graded index multimode fiber (100 μm core diameter, 20 m length). A section 14' of approximately 3 meters length was placed in a uniform magnetic field indicated by a dotted line box 24. The output of the fiber was focused onto the BaTiO₃ crystal 19 aligned to form a self-pumped phase conjugate mirror (PCM). The reflected phase conjugate light was also linearly-polarized along the x-axis by the polarizing beam splitter 18 and coupled back into the fiber by the objective lens 17. The 2 mm diameter aperture 16 was used to eliminate back-reflection from optical components.

Figure 5:
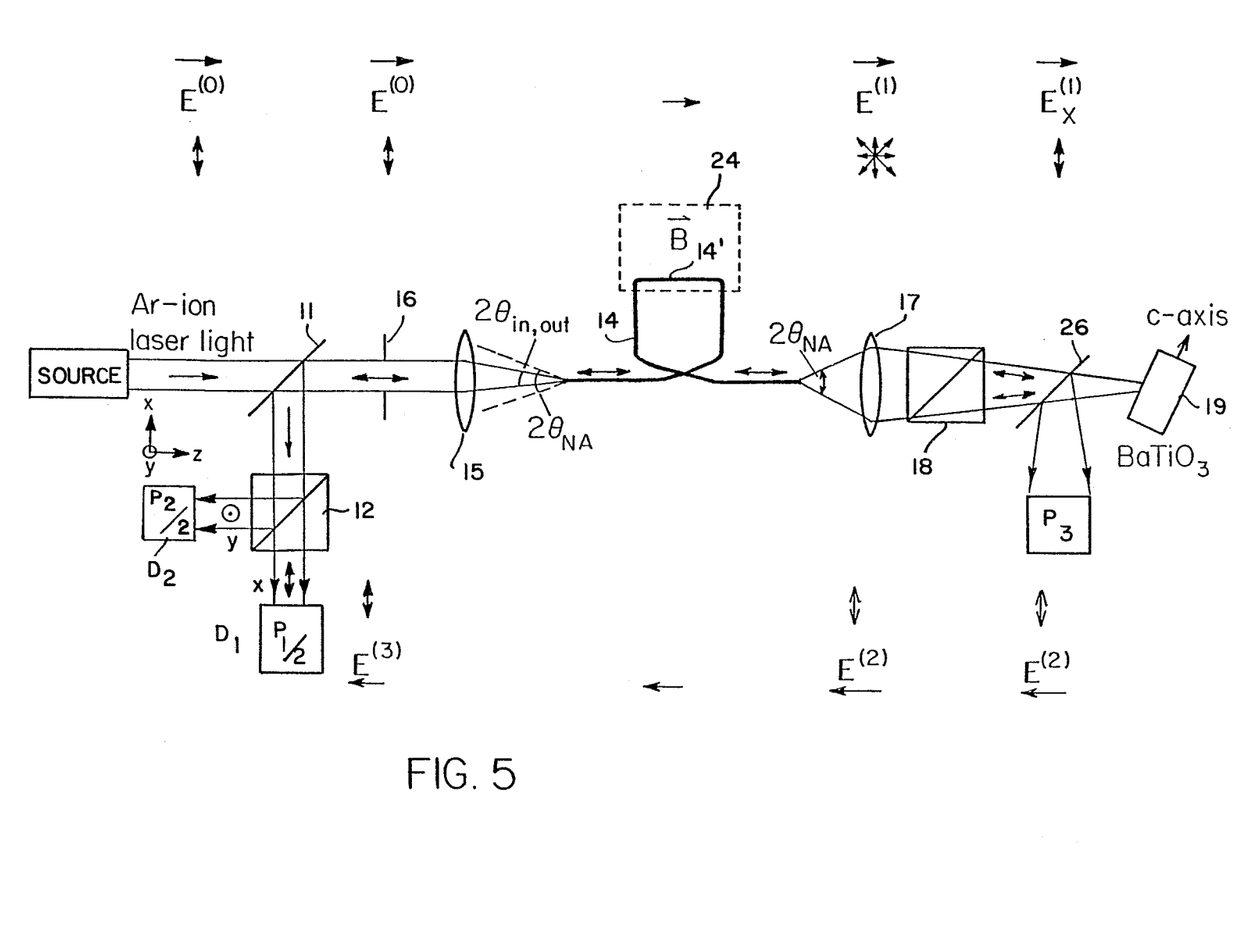
FIG. 5 illustrates an arrangement for demonstrating that polarization recovery is achieved even in the presence of a magnetic field producing a Faraday effect in the optical fiber.
Figure 6:
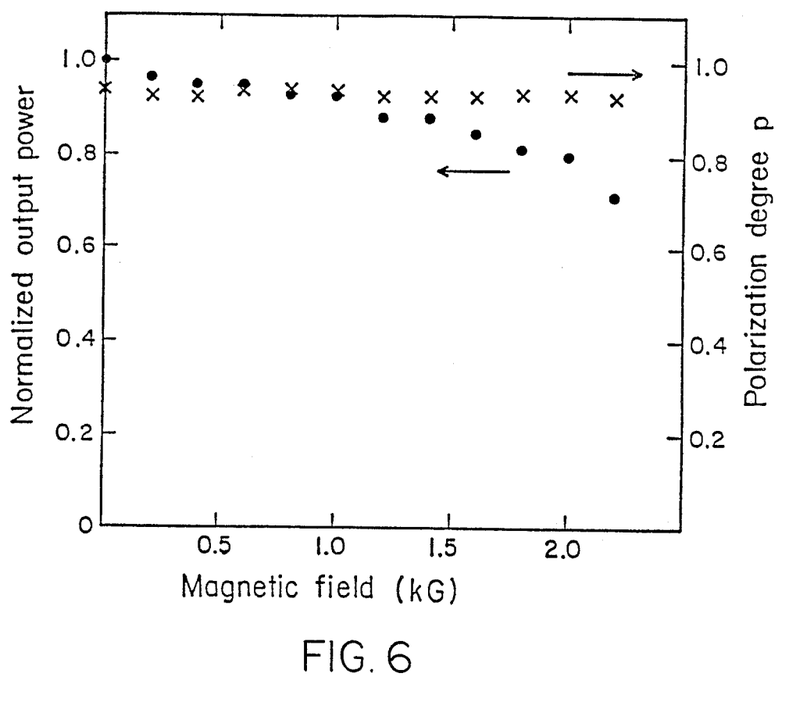
FIG. 6 is a graph which illustrates that the total normalized output power $P_1+P_2$ of a phase conjugate mirror decreases as a function of the magnetic field amplitude.

With a magnetic-field applied to the section 14' of the fiber, it was observed with the experimental arrangement of FIG. 5 that the quantity p remained very nearly unity over the range of 0 to 2.2 kG of magnetic field, as shown in FIG. 6 by plotted points indicated by x's. However, the total power output $P_1+P_2$ after a complete round trip through the fiber 14 decreased with increase in magnetic field, as shown in FIG. 6 by plotted points indicated by dots. Note that the beam splitter 11 in FIG. 5 serves essentially the same function as in FIG. 1(a), namely to deflect the reflected phase conjugated light toward a detector. Note also that the polarizing beam splitter 12, used to analyze the phase of the reflected phase conjugate light in the arrangement of FIG. 1(a), is omitted in the incident light path, and is instead placed in the reflected light path to analyze the optical power $P_1$ and $P_2$ of the two orthogonal polarization components of the reflected phase conjugate light more directly than in the arrangement of FIG. 1(a). The two arrangements are essentially the same, but note that both the detected power $P_1$ and the detected power $P_2$ have here been divided by 2 at the beam splitter 11. A polarization independent beam splitter 26 is used between the PCM crystal 19 and the polarization beam splitter 18 to measure the power $P_3$ of phase conjugated light using a detector $D_3$.

In spite of the fact that the PCM crystal 19 discards half of all the modes exiting the fiber (the "x" or "y" polarized modes), complete polarization recovery is achieved. The Faraday effect of the magnetic field, which induces a nonreciprocal Faraday rotation, is eliminated by the tandem combination of the mode scrambling fiber 14 and the photorefractive passive phase conjugation mirror (crystal 19). However, the total output power $P_1+P_2$ is decreased while the magnetic field is present, and the decrease is a function of the intensity of the magnetic field, as shown in FIG. 6 wherein normalized total output power $(P_1+P_2)/P_o$, where $P_o$ is the power of incident light of the laser by means not shown, such as simply a photodetector placed momentarily in front of the beam splitter before or after the measurement of $P_1$ and $P_2$, or both before and after.

There are various applications for the polarization recovery of the present invention. For example, it may be used in any optical fiber sensor in which only polarization recovery is important, and there is no need to detect loss of power, such as in an optical gyro where the Faraday effect due to the Earth's magnetic field is to be eliminated. It is also useful in determining the Verdet constant $v$, a proportionality factor in our equation of the Faraday effect of a transparent medium in a magnetic field from the relationship $\alpha=vlH$, where $\alpha$ is the angle of rotation of the plane of polarization of light, l is the length of the medium transversed by the light, and H is the intensity of the magnetic field.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A method for achieving true phase conjugation of an incident light wave of arbitrary polarization using a phase conjugate mirror comprising the steps of propagating said incident light wave through a polarization and mode scrambling medium in one direction to said phase conjugate mirror, and then, after phase conjugation, propagating the light wave back through said medium in a direction opposite said one direction.

2. A method for achieving true phase conjugation of an incident light wave of arbitrary polarization using a phase conjugate mirror in the presence of a magnetic field producing a Faraday effect on said incident light wave comprising the steps of propagating said incident light wave through a polarization and mode scrambling medium in one direction before phase conjugation by said phase conjugate mirror, and then, after phase conjugation, propagating the light wave back through said medium in a direction opposite said one direction.

3. A method of detecting the intensity of a magnetic field producing a Faraday effect on an incident light wave using a phase conjugate mirror comprising the steps of propagating said incident light wave through a polarization and mode scrambling medium in one direction before phase conjugation by said phase conjugate mirror, and then, after phase conjugation, propagating the light wave back through said medium in a direction opposite said one direction, and determining the of power of phase conjugated light after propagating back through said medium as a measure of magnetic field intensity.

4. Apparatus for achieving true phase conjugation of an incident light wave of arbitrary polarization comprising a polarization and mode scrambling medium and a phase conjugation mirror in sequence, with said medium in front of said mirror for passing incident and reflected light through said medium to and from said mirror whereby a light wave of arbitrary polarization which is first passed through said polarization and mode scrambling medium to said phase conjugate mirror in one direction, and then reflected back as a phase conjugated light wave through said medium in a direction opposite said one direction by said phase conjugate mirror, regains its original polarization state regardless of the wave's transverse components of polarization with respect to the axis of said phase conjugate mirror.

5. Apparatus as defined in claim 4 wherein said polarization and mode scrambling medium is comprised of a multimode fiber.

6. Apparatus as defined in claim 4 including a polarizing medium between said polarization and mode scrambling medium and said phase conjugate mirror, said polarizing medium being oriented to obtain linearly polarized light, and said phase conjugate mirror is comprised of a poled $BaTiO_3$ crystal aligned with the polarized light from said polarizing medium to form a self-pumped phase conjugate mirror, whereby said phase conjugated light wave propagated back through said polarization and mode scrambling medium returns said phase conjugate light wave to the complex polarization state of the incident light wave.

7. Apparatus as defined in claim 6 wherein said polarization and mode scrambling medium is comprised of a multimode fiber.

8. Apparatus as defined in claim 7 wherein at least a segment of said multimode fiber is subjected to the Faraday effect of a magnetic field.

9. Apparatus as defined in claim 8 including means for measuring the intensity of said magnetic field by measuring the total power of the complex conjugate wave returned for comparison with the power of the incident wave to determine loss of power as a function of the intensity of the magnetic field.

* * * * *

UNITED STATES PATENT AND TRADEMARK OFFICE
CERTIFICATE OF CORRECTION

PATENT NO. : 4,803,429
DATED : February 7, 1989
INVENTOR(S) : Kazuo Kyuma, Sze-Keung Kwong and Amnon Yariv It is certified that error appears in the above-identified patent and that said Letters Patent is hereby corrected as shown below:

In the title delete "DISTORING" and substitute -- DISTORTING --

Column 5, line 65, between M' and M* in Equation (9) insert -- $\phi$ --

Column 5, line 67, after "where" insert -- $\phi$ --

Column 8, line 23, after "the" insert -- uses --

Signed and Sealed this

Twenty-sixth Day of June, 1990

Attest:

HARRY F. MANBECK, JR.

*Attesting Officer*      *Commissioner of Patents and Trademarks*